(12) United States Patent
Charpin-Nicolle

(10) Patent No.: US 7,972,751 B2
(45) Date of Patent: Jul. 5, 2011

(54) REFLECTION PHOTOLITHOGRAPHY MASK, AND PROCESS FOR FABRICATING THIS MASK

(75) Inventor: Christelle Charpin-Nicolle, Fontanil-Cornillon (FR)

(73) Assignee: Commissariat a l'Energie Atmoique (FR)

( * ) Notice: Subject to any disclaimer, the term of this patent is extended or adjusted under 35 U.S.C. 154(b) by 166 days.

(21) Appl. No.: 12/097,381

(22) PCT Filed: Dec. 4, 2006

(86) PCT No.: PCT/EP2006/069255
§ 371 (c)(1),
(2), (4) Date: Oct. 28, 2008

(87) PCT Pub. No.: WO2007/068614
PCT Pub. Date: Jun. 21, 2007

(65) Prior Publication Data
US 2009/0191469 A1 Jul. 30, 2009

(30) Foreign Application Priority Data
Dec. 13, 2005 (FR) ...................................... 05 12609

(51) Int. Cl.
*G03F 1/00* (2006.01)
*G03F 7/00* (2006.01)
(52) U.S. Cl. .......................................... 430/5; 430/296

(58) Field of Classification Search .............. 430/5, 296
See application file for complete search history.

(56) References Cited

U.S. PATENT DOCUMENTS

| 5,112,707 | A | * | 5/1992 | Kato et al. ........................ 430/5 |
| 2001/0001734 | A1 | * | 5/2001 | Ekawa et al. .................. 438/690 |
| 2004/0115960 | A1 | | 6/2004 | Drouin et al. |
| 2004/0231971 | A1 | * | 11/2004 | Becker et al. ............. 204/192.11 |
| 2006/0222961 | A1 | * | 10/2006 | Yan .................................... 430/5 |
| 2007/0077499 | A1 | * | 4/2007 | Ikuta et al. ........................ 430/5 |

FOREIGN PATENT DOCUMENTS

| JP | 61128251 A | | 6/1986 |
| JP | 2006190900 A | * | 7/2006 |

OTHER PUBLICATIONS

Machine Translation of JP2006190900A. Translated Jul. 26, 2010.*

* cited by examiner

*Primary Examiner* — Mark F Huff
*Assistant Examiner* — Jonathan Jelsma
(74) *Attorney, Agent, or Firm* — Lowe Hauptman Ham & Berner, LLP

(57) ABSTRACT

The invention relates to an extreme ultraviolet photolithography mask, operating in reflection, the mask comprising a substrate, a mirror structure deposited uniformly on the substrate, and an absorbent layer which is absorbent at the operating wavelength of the mask and is deposited on top of the mirror structure and etched in a desired masking pattern. The absorbent layer contains indium among its principal constituents.

19 Claims, 2 Drawing Sheets

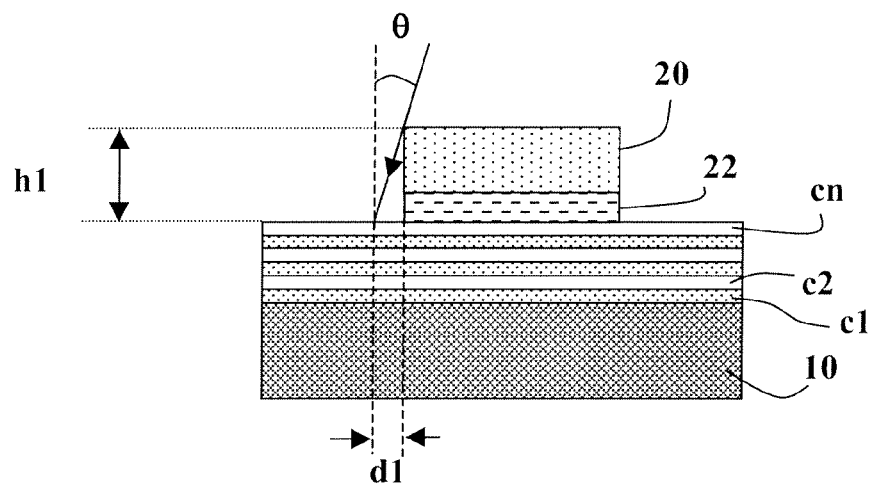
Fig. 1
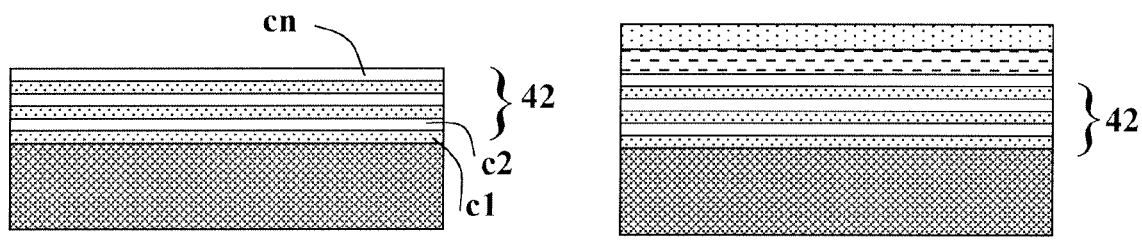
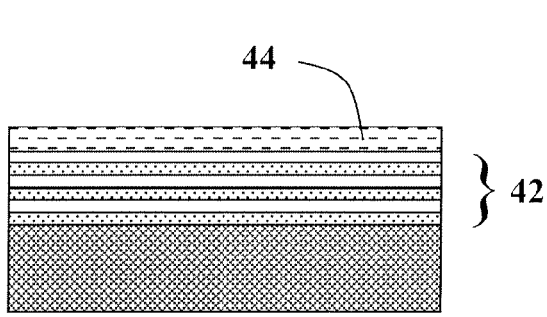
Fig. 2a
Fig. 2b
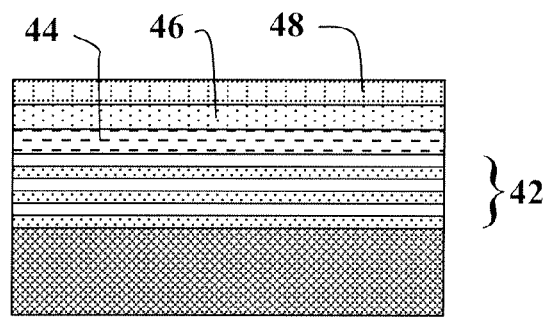
Fig. 2c
Fig. 2d

US 7,972,751 B2
REFLECTION PHOTOLITHOGRAPHY MASK, AND PROCESS FOR FABRICATING THIS MASK

CROSS-REFERENCE TO RELATED APPLICATIONS

The present Application is based on International Application No. PCT/EP2006/069255, filed on Dec. 4, 2006, which in turn corresponds to French Application No. 0512609 filed on Dec. 13, 2005, and priority is hereby claimed under 35 USC §119 based on these applications. Each of these applications are hereby incorporated by reference in their entirety into the present application.

FIELD OF THE INVENTION

The invention relates to photolithography, and notably to photolithography at very short wavelengths. It relates more precisely to a lithography mask structure intended for use in reflection and to a process for fabricating this mask structure.

BACKGROUND OF THE INVENTION

Photolithography is used to produce electronic optical or mechanical microstructures, or microstructures combining electronic and/or optical and/or mechanical functions. It consists in irradiating, with photon radiation, through a mask that defines the desired pattern, a photosensitive resin or photoresist layer deposited on a planar substrate (for example a silicon wafer). The chemical development that follows the irradiation reveals the desired patterns in the resist. The resist pattern thus etched may serve for several usages, the most common being the etching of an underlying layer (whether insulating or conducting or semiconducting) so as to define therein a pattern identical to that of the resist.

It is sought to obtain extremely small and precise patterns and to align etched patterns very precisely in multiple superposed layers. Typically, the critical dimension of the desired patterns is nowadays a fraction of a micron, or even a tenth of a micron and below.

Attempts have been made to use photolithographic processes not using light but electron or ion bombardment. These processes are more complex than photolithography processes using photons at various wavelengths (visible, ultraviolet, X-ray). Sticking to optical photolithography, it is the reduction in wavelength that allows the critical dimension of the features to be reduced. Ultraviolet photolithography (at wavelengths down to 193 nanometers) has become commonplace.

It is endeavored at the present time to go well below these wavelengths and to work in extreme ultraviolet (EUV) at wavelengths between 10 and 14 nanometers which are in practice soft X-ray wavelengths. The objective is to obtain a very high resolution, while still maintaining a low numerical aperture and a sufficient depth of field (greater than 1 micrometer).

At such wavelengths, one particular aspect of the photolithography process is that the resist exposure mask operates in reflection and not in transmission: the extreme ultraviolet light is projected onto the mask by a source; the mask comprises absorbent zones and reflecting zones; in the reflecting zones, the mask reflects the light onto the resist to be exposed, impressing its image thereon. The path of the light between the mask and the resist to be exposed passes via other reflectors, the geometries of which are designed so as to project a reduced image of the mask and not a full-size image. The image reduction makes it possible to etch smaller patterns on the exposed resist than those etched on the mask.

The mask itself is fabricated by photoetching a resist, this time in transmission, as will be explained later, and with a longer wavelength, permitted by the fact that the features are larger.

Typically, a reflection mask is made up of a planar substrate covered with a continuous reflecting structure, in practice a Bragg mirror structure, covered with an absorbent layer etched in the desired masking pattern.

The mirror must also be as reflective as possible at the working wavelength designed for the use of the mask. The absorbent layer must also be as absorbent as possible at this wavelength and must be deposited without causing deterioration of the reflecting structure, which notably implies deposition at not too high a temperature (below 150° C.). It must also be able to be etched without damaging the reflecting structure and in general a buffer layer is provided between the absorbent layer and the mirror. The height of the stack comprising the buffer layer and the absorbent layer must be as small as possible so as to minimize the shadowing effects when the incidence of the radiation is not perfectly normal to the surface of the mask.

SUMMARY OF THE INVENTION

To reconcile these various requirements, the invention proposes to use as absorbent layer an indium-based material, either pure indium or in the form of an alloy with other materials and preferably with phosphorus and/or gallium arsenide and/or antimony. The preferred alloys are InP, InGaAsP and InSb.

Consequently, the invention provides an extreme ultraviolet photolithography mask (for wavelengths between 10 and 14 nanometers), operating in reflection, comprising a substrate, a reflecting structure deposited uniformly on the substrate, and an absorbent layer which is absorbent at the operating wavelength of the mask and is deposited on top of the reflecting structure and etched in a desired masking pattern, this mask being characterized in that the absorbent layer contains indium as principal absorbent constituent.

Preferably, a buffer layer (or etch stop layer) facilitating the selective etching of the absorbent layer relative to the reflecting structure (and therefore preventing deterioration of the latter) is interposed between the reflecting structure and the absorbent layer.

Preferably, the buffer layer is based on aluminum oxide, most particularly when the absorbent layer is made of indium phosphide.

The invention is mainly applicable to what are called "binary" masks in which the pattern is defined simply by the strong absorption of the extreme ultraviolet rays in the zones comprising the absorbent layer and the strong reflection in the zones that do not comprise the absorbent layer. However, the invention is also applicable to what are called "attenuated phase shift" masks in which the pattern is defined not only by this difference in absorption but also by the increase in contrast due to the phase difference between the rays reflected in the absorbent zones and the rays reflected in the neighboring nonabsorbent zones.

The invention also relates, in addition to the mask itself, to a process for fabricating an extreme ultraviolet reflection photolithography mask (operating at wavelengths between 10 and 14 nanometers), in which they are deposited, on a substrate coated with a reflecting structure which is reflective at the operating wavelength of the mask, an absorbent layer which is absorbent at this wavelength followed by a photolithography resist, the resist is irradiated in a desired exposure pattern, the resist is developed and the absorbent layer is etched through the resist pattern remaining, so as to define a pattern of zones that are absorbent at the operating wavelength of the mask, characterized in that the absorbent layer is a layer based on indium as principal absorbent constituent of the layer.

Among the advantages of indium, and most particularly of indium phosphide, there is also the fact that its reflectivity is low in deep ultraviolet at 257 nanometers. Now, this low reflectivity is useful for optical inspection of the mask at this wavelength for the purpose of discovering any defects in the absorbent layer.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein:

FIG. 1 shows a mask of the prior art of the binary type, operating in reflection; and FIGS. 2a to 2d and 3a to 3e show the main steps in the fabrication of an EUV mask according to the invention operating in reflection.

DESCRIPTION OF PREFERRED EMBODIMENTS

Figure 3A:
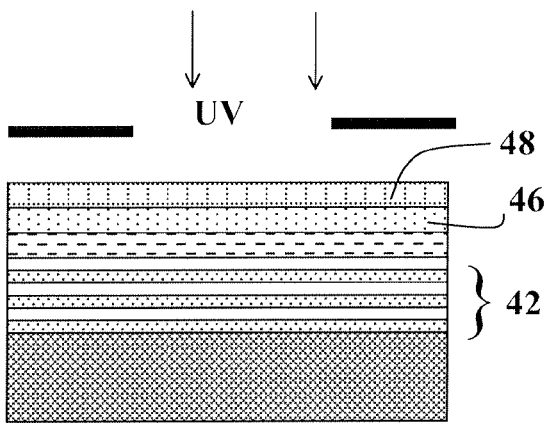

FIG. 1 shows a "binary" photolithography mask of the prior art operating in extreme ultraviolet reflection. It is made up of a planar substrate 10 covered with a continuous reflecting structure. The reflecting structure is a superposition of layers c1, c2, . . . cn which are transparent at the extreme ultraviolet wavelength at which the mask will be used in reflection. The layers are alternating layers of different optical index and their thicknesses are chosen according to the indices and the operating wavelength so as to constitute a Bragg mirror having a high reflection coefficient at this wavelength.

The Bragg mirror thus formed is coated with an absorbent layer 20, which is absorbent at this wavelength and is etched in the desired masking pattern. This pattern is geometrically in a ratio greater than 1 (typically a ratio of 4) with the pattern that the mask will project during use onto a layer to be etched.

A buffer layer 22 is in principle provided between the absorbent layer and the reflecting structure. Said buffer layer possibly contributes to the absorption but it serves above all as an etch stop layer during photoetching of the absorbent layer.

In the prior art, the materials used as absorbent layer are typically metals such as titanium, tantalum, tungsten, chromium or aluminum, and also compounds of these metals such as tantalum silicide, titanium nitride and titanium-tungsten.

The thickness of the stack comprising the buffer layer and the absorbent layer is relatively large whenever it is desired to obtain a sufficient absorption (reflection less than 0.5%). For example, 70 nm of chromium on 90 nm of silica buffer layer is typically required.

This overall height is large and results in non-negligible shadowing effects as illustrated in FIG. 1: rays arriving obliquely at an angle of incidence θ (even when θ is low) are masked over a distance d1, to the detriment of resolution during use of the mask. For a given angle of incidence, the distance d1 is greater the higher the height h1 of the stack.

According to the invention, it has been found that indium can be used as principal constituent of the absorbent layer, by itself or alloyed with other compounds, while still conforming to considerable constraints such as low-temperature deposition so as not to damage the subjacent reflecting structure. A much smaller absorbent stack height, for example about 40 nanometers, can then be used, thereby reducing the shadowing effects.

The preferred absorbent layer is an indium phosphide (InP) alloy. Other alloys can be used, notably InGaAsP and InSb.

Most particularly when the absorbent layer is made of indium phosphide, the buffer layer or etch stop layer is preferably alumina ($Al_2O_3$). This may also be silica ($SiO_2$) or else an alternating stack of alumina and chromium.

It is also conceivable for the absorbent layer to be made up of a stack of at least one indium-based layer and another layer based on a material used in the prior art, such as titanium or tantalum or chromium, etc.).

The process for producing the mask will now be described in its major steps with reference to FIGS. 2a to 2d and 3a to 3e.

Figure 3B:
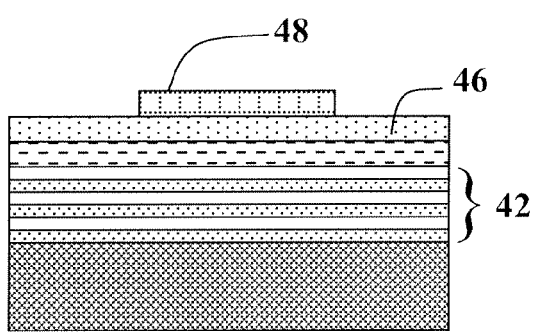
Figure 3C:
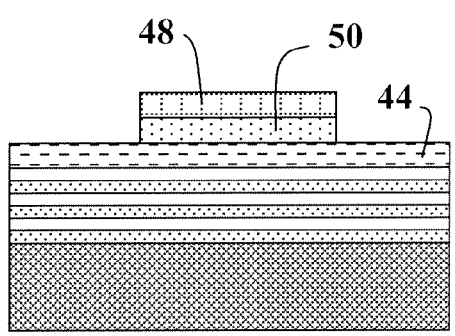
Figure 3D:
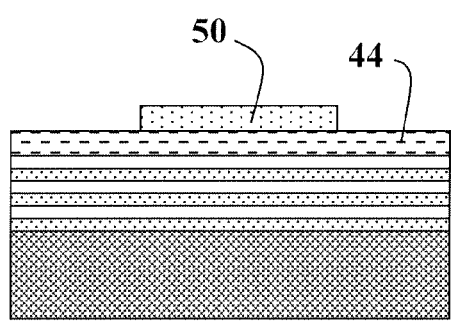
Figure 3E:
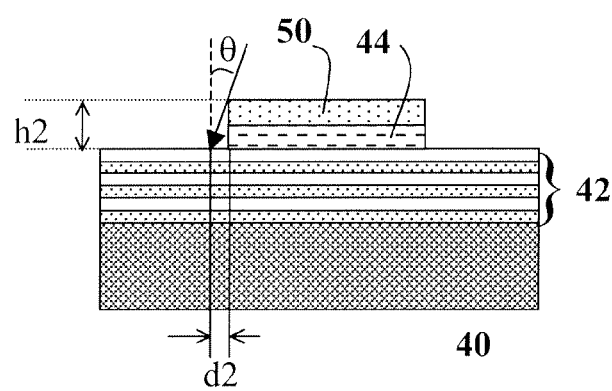

The main steps are the following:

deposition of a reflecting structure on a planar substrate 40, said structure being reflective at the operating wavelength of the extreme ultraviolet mask. The structure is a stack 42 of an alternation of transparent layers c1, c2, . . . cn of different indices and thicknesses chosen according to the indices so as to constitute a reflecting structure of the Bragg mirror type (FIG. 2a);

deposition of a buffer layer 44 acting as etch stop layer, which will be explained later (FIG. 2b);

deposition of an indium-based layer 46 on the buffer layer (FIG. 2c) for the purpose of producing the absorbent element of the mask for extreme ultraviolet wavelengths;

spreading of a photosensitive resin or photoresist 48 on the indium-based layer (FIG. 2d);

production, by ultraviolet photolithography in the resist, of a pattern corresponding to the mask pattern to be produced (FIGS. 3a and 3b). The ultra-violet irradiation wavelength is not in the extreme ultraviolet, rather it is a much longer wavelength at which the resist is sensitive, for example about 248 nanometers. Irradiation using an electron beam on a resist sensitive to this type of beam is also possible;

etching of the indium-based layer (FIG. 3c) causing a pattern of absorbent zones 50 to appear. The etching is stopped when the buffer layer 4 starts to be etched, which means that the entire thickness of the indium-based layer has been removed at a point where it has to be removed;

removal of the photoresist 48 (FIG. 3d); and etching of the buffer layer 44 causing the reflecting structure to appear between the absorbent zones 50 of the mask, which is now complete (FIG. 3e).

The role of the buffer layer is to protect the surface of the reflecting structure during etching of the indium-based layer. This is because the etchants used for etching the indium-based layer run the risk of damaging the surface layers of the reflecting structure at the end of etching this layer, which is unacceptable, the quality of the reflecting structure being essential. The buffer layer is etched more slowly than the absorbent layer by the etchants for the latter. Moreover, the buffer layer must be able to be etched selectively relative to the upper layer of the Bragg mirror so that this upper layer is not etched while the buffer layer is being etched.

The use of an indium-based material for producing the absorbent layer reduces the shadowing effects on the surface of the reflective coating of the mask. This is because the absorptivity of indium at the envisioned wavelengths (10 to 14 nanometers, and most particularly between 13 and 14 nanometers) is such that an absorbent layer having a thickness of around twenty nanometers and not around sixty nanometers or higher can be used. Furthermore, owing to the etchants used to etch the absorbent layer, a buffer layer can also be provided with a thickness of around 20 nanometers. This is in particular the case if the absorbent layer is made of indium phosphide and if the buffer layer is made of alumina. By reducing the thickness of the absorbent layer and of the buffer layer, and therefore the total thickness h2 of the absorbent stack, the shadowing effects are reduced to a lateral distance d2 (FIG. 3e), which is smaller than d1 (FIG. 1) for the same angle of incidence θ.

It should be noted that the buffer layer, most particularly if it comprises alumina, may serve as reflecting layer for "visual" inspection of defects in the absorbent layer, which inspection is carried out in deep UV at 257 nanometers.

The buffer layer may also be made of silica or be formed by a stack of several layers, for example chromium and aluminum oxide layers.

In an alternative form of the process for fabricating the mask operating in reflection according to the invention, the absorbent layer comprises one or more metallic layers. For example, the absorbent layer may be formed by a stack of indium-based layers and at least one metallic layer. The metallic layer may be made of titanium, tantalum, tungsten, chromium or ruthenium.

A detailed example of the implementation of the procedure for fabricating the mask according to the invention will now be described:

production of a reflective coating on the substrate by ion beam sputtering. Sputtered onto the substrate are several tens of pairs of transparent layers, for example 40 pairs, each pair comprising a molybdenum layer and a silicone layer. The total thickness of each pair is about 6.9 nanometers for optimum reflection at a wavelength of about 13.8 nanometers. The reflection coefficient then exceeds 60% and may even reach 75%. The pairs of layers may also be molybdenum/beryllium or ruthenium/beryllium pairs. The substrate may be a silicon wafer or a glass or quartz plate 200 mm in diameter. The flatness of the substrate must be high and it is preferable for the flatness imperfections not to exceed 0.4 microns for a wafer of this diameter. The sputtered deposition is preferably carried out at a temperature of about 50° C.;

deposition of an aluminum oxide ($Al_2O_3$) buffer layer with a thickness of about 20 nanometers on the reflective coating. The deposition of this stop layer is carried out by atomic layer chemical vapor deposition at a temperature of 120° C., which is acceptable for the subjacent reflecting structure;

low-temperature deposition (at below 100° C.) of an extreme ultraviolet absorbent layer, based on InP and with a thickness of about 20 nanometers, on the buffer layer, using a molecular beam epitaxy machine;

spreading of a lithographic resist, such as a resist of the PMMA (polymethyl methacrylate) type sold by the company Rhom & Haas Electronics Materials or RHEM;

production of a desired pattern in the resist by UV lithography (for example at 248 nanometers) or by electron-beam lithography;

etching, for example plasma etching, of the indium-based material at a temperature of around 100° C., for example using a $Cl_2$/Ar chemistry, in order to remove the absorbent layer just where it is not protected by the resist. The plasma etching gases depend on the material to be etched. The buffer layer protects the Bragg mirror at the end of this etching operation;

removal of the resist, for example in two steps, namely dry stripping followed by wet extraction, for example by EKC 265 treatment, the product EKC 265 being sold by the company EKC and corresponding to the resist indicated above. The temperature reached is between 65° C. and 70° C., which is acceptable. The dry stripping is carried out using argon, oxygen and $CF_4$. The temperature reached during the dry stripping is between 54° C. and 60° C., which is acceptable; and removal of the buffer layer just where it is not protected by the InP absorbent layer, so as to locally bare the reflective coating. This step may, for example in the case of an $Al_2O_3$ stop layer, be HF chemical etching by using a 1% solution, which does not etch the absorbent layer and does not damage the subjacent reflecting structure.

The mask thus produced according to the invention, having been the subject of tests and simulations, has the following characteristics: the absorption index in the EUV (at 13.5 nanometers) of the InP is 0.0568. This index obtained is better than those of the materials used in the prior art, such as TaN having an absorption index of 0.044 and chromium having an index of 0.0383. Indium has an absorption index of 0.07.

By simulation, the reflectivity of the stack comprising the 20 nanometer InP base layer and the 20 nanometer $Al_2O_3$ layer was found to be less than 0.5% for illumination in EUV (13.5 nanometers). The software used for simulation was XOP software.

The EUV mask operating in reflection is satisfactory for an absorbent stack thickness (h2) significantly smaller than that of the masks of the prior art since an overall thickness of 40 nanometers is sufficient, this being much smaller than the 160-nanometer thickness of the prior art (70 nm of Cr+90 nm of silica).

The invention has been described in detail with regard to a binary mask, but it may also be used to produce an attenuated phase shift mask in which the absorbent layer not only plays an absorbent role but also a role of phase shifting the light fraction that it reflects.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An extreme ultraviolet photolithography mask, operating in reflection, comprising a substrate, a reflecting structure deposited uniformly on the substrate, and an absorbent layer which is absorbent at the operating wavelength of the mask and is deposited on top of the reflecting structure and etched in a desired masking pattern, wherein the absorbent layer contains indium as principal absorbent constituent and wherein the absorbent layer is an indium-based material chosen from the following materials: In, InP, InGaAsP and InSb.

2. The photolithography mask as claimed in claim 1, wherein the absorbent layer is produced by a stack of indium-based layers and of at least one metallic layer, the metal being chosen from titanium, tantalum and chromium.

3. The photolithography mask as claimed in claim 1, wherein a buffer layer, facilitating the selective etching of the absorbent layer relative to the reflecting structure, is interposed between the reflecting structure and the absorbent layer.

4. The photolithography mask as claimed in claim 3, wherein the buffer layer is a layer of aluminum oxide ($Al_2O_3$) or silica.

5. The photolithography mask as claimed in claim 3, wherein the buffer layer is a stack of several layers, chosen from chromium and aluminum oxide layers.

6. The photolithography mask as claimed in claim 4, wherein, in an InP absorbent layer/$Al_2O_3$ buffer layer stack, the InP absorbent layer has a thickness of about 20 nanometers and the $Al_2O_3$ buffer layer has a thickness of about 20 nanometers.

7. A process for fabricating an extreme ultraviolet reflection photolithography mask, in which there are deposited, on a substrate coated with a reflecting structure which is reflective at the operating wavelength of the mask, an absorbent layer which is absorbent at the operating wavelength followed by a photolithography resist, the resist is irradiated in a desired exposure pattern, the resist is developed and the absorbent layer is etched through the resist pattern remaining, so as to define a pattern of zones that are absorbent at the operating wavelength of the mask, wherein the absorbent layer is a layer based on indium as principal absorbent constituent of the layer and wherein the absorbent layer is an indium-based material chosen from the following materials: In, InP, InGaAsP and InSb.

8. The process as claimed in claim 7, comprising the following steps:
   deposition of a reflecting structure, consisting of a stack of an alternation of layers that are transparent at the operating wavelength of the mask and have different indices, on a substrate I
   deposition of a buffer layer;
   deposition of the indium-based absorbent layer on the buffer layer;
   spreading of a lithography resist on the indium-based layer;
   production of a desired resist pattern by ultraviolet or electron-beam lithography;
   plasma etching of the indium-based layer just where the indium-based layer is not protected by the resist; and
   removal of the remaining resist and etching of the buffer layer just where it is not protected by the absorbent layer.

9. The process as claimed in claim 8, wherein the resist photolithography step is carried out with ultraviolet radiation at a wavelength much longer than the operating wavelength of the mask.

10. The process as claimed in claim 7, wherein the reflecting structure is produced by ion beam sputtering of several tens of pairs of layers, the overall thickness of each pair being about 6.9 nanometers.

11. The process as claimed in claim 7, wherein the absorbent layer is made of InP with a thickness of about 20 nanometers and a buffer layer is made of aluminum oxide ($Al_2O_3$) with a thickness of about 20 nanometers.

12. The process as claimed in claim 7, wherein the absorbent layer is produced by low-temperature deposition (below about 100° C.) of a layer based on indium phosphide.

13. The photolithography mask as claimed in claim 2, wherein a buffer layer, facilitating the selective etching of the absorbent layer relative to the reflecting structure, is interposed between the reflecting structure and the absorbent layer.

14. The photolithography mask as claimed in claim 13, wherein the buffer layer is a layer of aluminum oxide ($Al_2O_3$) or silica.

15. The photolithography mask as claimed in claim 13, wherein the buffer layer is a stack of several layers, chosen from chromium and aluminum oxide layers.

16. The photolithography mask as claimed in claim 1, wherein the absorbent layer is produced by a stack of indium-based layers and of at least one metallic layer, the metal being chosen from titanium, tantalum and chromium.

17. The photolithography mask as claimed in claim 1, wherein a buffer layer, facilitating the selective etching of the absorbent layer relative to the reflecting structure, is interposed between the reflecting structure and the absorbent layer.

18. The process as claimed in claim 8, wherein the reflecting structure is produced by the ion beam sputtering of several tens of pairs of layers, the overall thickness of each pair being about 6.9 nanometers.

19. The process as claimed in claim 9, wherein the reflecting structure is produced by the ion beam sputtering of several tens of pairs of layers, the overall thickness of each pair being about 6.9 nanometers.

* * * * *